United States Patent
Huang et al.

(10) Patent No.: US 8,367,473 B2
(45) Date of Patent: Feb. 5, 2013

(54) SUBSTRATE HAVING SINGLE PATTERNED METAL LAYER EXPOSING PATTERNED DIELECTRIC LAYER, CHIP PACKAGE STRUCTURE INCLUDING THE SUBSTRATE, AND MANUFACTURING METHODS THEREOF

(75) Inventors: Shih-Fu Huang, Zhudong Township (TW); Yuan-Chang Su, Luzhu Township (TW); Chia-Cheng Chen, Zhongli (TW); Ta-Chun Lee, Taipei (TW); Kuang-Hsiung Chen, Taoyuan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 275 days.

(21) Appl. No.: 12/779,800

(22) Filed: May 13, 2010

(65) Prior Publication Data
US 2010/0314744 A1   Dec. 16, 2010

Related U.S. Application Data (60) Provisional application No. 61/177,652, filed on May 13, 2009.

(30) Foreign Application Priority Data

Aug. 4, 2009 (TW) ............................... 98126172 A (51) Int. Cl.
H01L 21/768 (2006.01)
H01L 21/786 (2006.01)
(52) U.S. Cl. ................ 438/110; 257/690; 257/E21.589; 438/113; 438/114; 438/118
(58) Field of Classification Search .................. 438/110, 438/113, 114, 118
See application file for complete search history.

(56) References Cited

U.S. PATENT DOCUMENTS

| | | | |
|---|---|---|---|
| 5,583,376 | A | 12/1996 | Sickler et al. |
| 5,592,025 | A | 1/1997 | Clark et al. |
| 5,874,784 | A | 2/1999 | Aoki et al. |
| 5,994,773 | A | 11/1999 | Hirakawa |
| 6,060,775 | A | 5/2000 | Ano |
| 6,080,932 | A | 6/2000 | Smith et al. |
| 6,087,717 | A | 7/2000 | Ano et al. |
| 6,177,636 | B1 | 1/2001 | Fjelstad |
| 6,198,165 | B1 | 3/2001 | Yamaji et al. |
| 6,232,650 | B1 | 5/2001 | Fujisawa et al. |

(Continued)

OTHER PUBLICATIONS

Huang et al., U.S. Appl. No. 12/779,818, filed May 13, 2010 for "Semiconductor Package With Substrate Having Single Metal Layer and Manufacturing Methods Thereof." Office Action mailed Oct. 11, 2011.

*Primary Examiner* — Ha Tran T Nguyen
*Assistant Examiner* — Raj R Gupta
(74) *Attorney, Agent, or Firm* — Foley & Lardner LLP (57) ABSTRACT

A chip package structure includes a substrate, a die, and a package body. The substrate includes a single patterned, electrically conductive layer, and a patterned dielectric layer adjacent to an upper surface of the electrically conductive layer. A part of a lower surface of the electrically conductive layer forms first contact pads for electrical connection externally. The patterned dielectric layer exposes a part of the upper surface of the electrically conductive layer to form second contact pads. The electrically conductive layer exposes the lower surface of the patterned dielectric layer on a lower periphery of the substrate. The die is electrically connected to the second contact pads, the patterned dielectric layer and the die being positioned on the same side of the electrically conductive layer. The package body is disposed adjacent to the upper surface of the electrically conductive layer and covers the patterned dielectric layer and the die.

18 Claims, 5 Drawing Sheets

U.S. PATENT DOCUMENTS

| | | |
|---|---|---|
| 6,232,661 B1 | 5/2001 | Amagai et al. |
| 6,242,815 B1 | 6/2001 | Hsu et al. |
| 6,271,057 B1 | 8/2001 | Lee et al. |
| 6,331,451 B1 | 12/2001 | Fusaro et al. |
| 6,358,780 B1 | 3/2002 | Smith et al. |
| 6,552,430 B1 | 4/2003 | Perez et al. |
| 6,580,159 B1 | 6/2003 | Rodriguez et al. |
| 6,663,946 B2 | 12/2003 | Seri et al. |
| 6,774,317 B2 | 8/2004 | Fjelstad |
| 6,861,757 B2 | 3/2005 | Shimoto et al. |
| 6,977,348 B2 | 12/2005 | Ho et al. |
| 7,338,884 B2 * | 3/2008 | Shimoto et al. ............... 438/459 |
| 7,405,486 B2 | 7/2008 | Kato |
| 7,423,340 B2 | 9/2008 | Huang et al. |
| 7,566,969 B2 | 7/2009 | Shimanuki |
| 7,595,553 B2 | 9/2009 | Nagamatsu et al. |
| 7,612,295 B2 | 11/2009 | Takada et al. |
| 7,902,648 B2 | 3/2011 | Lee |
| 7,948,090 B2 | 5/2011 | Manepalli et al. |
| 2002/0030266 A1 | 3/2002 | Murata |
| 2002/0153618 A1 | 10/2002 | Hirano et al. |
| 2002/0171145 A1 | 11/2002 | Higuchi et al. |
| 2002/0173069 A1 | 11/2002 | Shibata |
| 2002/0182776 A1 | 12/2002 | Fujisawa et al. |
| 2002/0192872 A1 | 12/2002 | Fujisawa et al. |
| 2003/0030137 A1 | 2/2003 | Hashimoto |
| 2003/0034553 A1 | 2/2003 | Ano |
| 2003/0098502 A1 | 5/2003 | Sota |
| 2004/0080054 A1 | 4/2004 | Chinda et al. |
| 2004/0110319 A1 * | 6/2004 | Fukutomi et al. ............. 438/106 |
| 2005/0186704 A1 | 8/2005 | Yee et al. |
| 2007/0234563 A1 | 10/2007 | Sakaguchi et al. |
| 2007/0272940 A1 | 11/2007 | Lee et al. |
| 2008/0284017 A1 | 11/2008 | Lee et al. |
| 2009/0115072 A1 | 5/2009 | Rhyner et al. |
| 2009/0294160 A1 | 12/2009 | Yoshimura et al. |
| 2010/0288541 A1 | 11/2010 | Appelt et al. |
| 2010/0289132 A1 | 11/2010 | Huang et al. |
| 2010/0320610 A1 | 12/2010 | Huang et al. |
| 2011/0057301 A1 | 3/2011 | Chen et al. |
| 2011/0074008 A1 | 3/2011 | Hsieh |
| 2011/0084370 A1 | 4/2011 | Su et al. |
| 2011/0084372 A1 | 4/2011 | Su et al. |
| 2011/0169150 A1 | 7/2011 | Su et al. |

* cited by examiner

SUBSTRATE HAVING SINGLE PATTERNED METAL LAYER EXPOSING PATTERNED DIELECTRIC LAYER, CHIP PACKAGE STRUCTURE INCLUDING THE SUBSTRATE, AND MANUFACTURING METHODS THEREOF

CROSS-REFERENCES TO RELATED APPLICATIONS

The present application claims the benefit of U.S. Provisional Application No. 61/177,652, filed on May 13, 2009, and Taiwan Application No. 98126172, filed on Aug. 4, 2009, the subject matters of which are incorporated herein by reference.

FIELD OF THE INVENTION

The present invention generally relates to electronic device packaging. More particularly, the present invention relates to a substrate having a single patterned metal layer exposing a patterned dielectric layer, a chip package structure including the substrate, and manufacturing methods thereof.

BACKGROUND

Integrated circuit (IC) package technology plays an important role in the electronics industry. As light weight, compactness, and high efficiency have become typical requirements of consumer electronic and communication products, chip packages should provide superior electrical properties, small overall volume, and a large number of I/O ports. Substrates used in these chip packages often have multiple metal layers that can be electrically connected using traces and/or vias. As the size of chip packages decreases, these traces and vias for connecting the multiple metal layers can become smaller and more closely spaced, which can increase the cost and complexity of integrated circuit packaging processes. It is therefore desirable to develop a substrate that has a thin profile, that is manufactured by a less complex process, that is suitable for mass production, and that can be produced with high production yield. It is also desirable to develop corresponding packages including the substrate, and manufacturing methods of the substrate and of the corresponding packages.

SUMMARY

Accordingly, one aspect of the present invention is directed to a substrate having a single patterned metal layer exposing a patterned dielectric layer, a chip package structure including the substrate, and manufacturing methods thereof.

In one innovative aspect, embodiments of the invention relate to a chip package structure. In one embodiment, the chip package structure includes a substrate, a die, and a package body. The substrate includes: (a) a single patterned, electrically conductive layer including an upper surface and a lower surface; and (b) a patterned dielectric layer adjacent to the upper surface of the single patterned, electrically conductive layer and including a lower surface. A part of the lower surface of the single patterned, electrically conductive layer forms a plurality of first contact pads for electrical connection externally. The patterned dielectric layer exposes a part of the upper surface of the single patterned, electrically conductive layer to form a plurality of second contact pads. The single patterned, electrically conductive layer exposes the lower surface of the patterned dielectric layer on a lower periphery of the substrate. The die is electrically connected to the plurality of second contact pads, the patterned dielectric layer and the die being positioned on the same side of the single patterned, electrically conductive layer. The package body is disposed adjacent to the upper surface of the single patterned, electrically conductive layer and covers the patterned dielectric layer and the die.

In another innovative aspect, embodiments of the invention relate to a method of manufacturing chip packages. In one embodiment, the method includes providing a superstrate including an array of substrates, each substrate including: (a) a single patterned metal layer including an upper surface and a lower surface; and (b) a patterned dielectric layer adjacent to the upper surface of the single patterned metal layer and including a lower surface. A part of the lower surface of the single patterned metal layer forms a plurality of lower contact pads for electrical connection externally. The patterned dielectric layer exposes a part of the upper surface of the single patterned metal layer to form a plurality of upper contact pads. At least a part of the lower surface of the single patterned metal layer and a part of the lower surface of the patterned dielectric layer define a lower surface of the substrate. The method further includes forming a molded structure on the patterned dielectric layer to cover the patterned dielectric layer and the die. The method further includes performing a full-cutting of the molded structure and the superstrate to form a plurality of chip packages, each of the plurality of chip packages including a package body and one of the array of substrates, such that the package body, the patterned dielectric layer, and the single patterned metal layer of each of the plurality of chip packages are laterally aligned.

BRIEF DESCRIPTION OF THE DRAWINGS

The accompanying drawings are included to provide a further understanding of some embodiments of the invention, and are incorporated in and constitute a part of this specification. The drawings illustrate embodiments of the invention and, together with the description, serve to explain the principles of some embodiments of the invention.

DETAILED DESCRIPTION

Reference will now be made in detail to some embodiments of the invention, examples of which are illustrated in the accompanying drawings. Wherever possible, the same reference numbers are used in the drawings and the descriptions to refer to the same or like parts.

Definitions

The following definitions apply to some of the aspects described with respect to some embodiments of the invention. These definitions may likewise be expanded upon herein.

As used herein, the singular terms "a", "an" and "the" include plural referents unless the context clearly dictates otherwise. Thus, for example, reference to a die can include multiple dies unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, terms such as "inner," "top," "upper," "bottom," "above," "below," "upwardly," "downwardly," "side," and "lateral" refer to a relative orientation of a set of components, such as in accordance with the drawings, but do not require a particular orientation of those components during manufacturing or use.

As used herein, the terms "connect", "connected" and "connection" refer to an operational coupling or linking. Connected components can be directly coupled to one another or can be indirectly coupled to one another, such as via another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the term "conductive" refers to an ability to transport an electric current. Electrically conductive materials typically correspond to those materials that exhibit little or no opposition to flow of an electric current. One measure of electrical conductivity is in terms of Siemens per meter ("$S \cdot m^{-1}$"). Typically, an electrically conductive material is one having a conductivity greater than about $10^4$ such as at least about $10^5$ $S \cdot m^{-1}$ or at least about $10^6$ $S \cdot m^{-1}$. Electrical conductivity of a material can sometimes vary with temperature. Unless otherwise specified, electrical conductivity of a material is defined at room temperature.

As used herein, the term "substrate" refers to a supporting structure in a chip package structure. In some embodiments, the term can refer to the portion of a superstrate that is included in an individual chip package structure. The superstrate can, for example, be an array of substrates that is singulated to form each individual substrate.

Embodiments of the present invention can be used for fabricating various package structures, such as stacked type packages, multiple-chip packages, or high frequency device packages.

Description

Embodiments of a substrate having single patterned, electrically conductive layer exposing a patterned dielectric layer, a package including the substrate, and manufacturing methods thereof are disclosed. In one embodiment, the substrate is a two-layer structure comprising a single patterned, electrically conductive layer and a patterned dielectric layer. Alternatively, the substrate may additionally include one or more surface finish layers of minimal thickness adjacent to the single patterned, electrically conductive layer. The single patterned, electrically conductive layer includes an upper surface and a lower surface. A part of the lower surface of the single patterned, electrically conductive layer forms a plurality of lower contact pads (such as ball pads) for electrical connection externally. The patterned dielectric layer is formed adjacent to the upper surface of the single patterned, electrically conductive layer. The patterned dielectric layer exposes a part of the upper surface of the single patterned, electrically conductive layer to form a plurality of upper contact pads (such as bonding pads). The single, patterned electrically conductive layer exposes the lower surface of the patterned dielectric layer on a lower periphery of the substrate. The patterned dielectric layer and the die are positioned at the same side of the single patterned, electrically conductive layer.

Because the substrate includes a single patterned metal layer and a single patterned dielectric layer (instead of multiple patterned metal layers and/or multiple dielectric layers), the thickness of the substrate is reduced, giving rise to a lower profile package. This thinner substrate is particularly suitable for small-size product applications. Also, embodiments of methods for manufacturing the substrates and packages disclosed herein may use a carrier, which render the methods simple, easy to perform, and suitable for mass production. Embodiments of the substrate have advantages of high yield of production, thin profile, and low cost. Electronic products including the substrate and/or the chip package structure of embodiments of the present invention can leverage these advantages to reduce the size and the cost of these products, which is commercially desirable.

Several embodiments are described and illustrated to demonstrate the structures of the substrate, chip packages including the substrate, and manufacturing methods thereof. These descriptions and illustrations do not limit the invention. Those of skill in the art would know that modifications and variations to these embodiments can be made within the scope of the invention to meet requirements of practical applications.

It is also important to point out that the illustrations may not be necessarily be drawn to scale, and that there may be other embodiments of the present invention which are not specifically illustrated. Thus, the specification and the drawings are to be regarded as illustrative rather than restrictive. Additionally, the drawings illustrating the embodiments of the present invention may focus on certain major characteristic features for clarity.

First Set of Embodiments

Figure 1A:
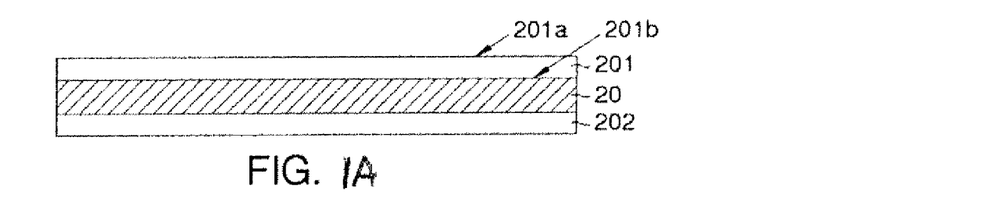
FIGS. 1A through 1G are schematic views showing a method of manufacturing a substrate having a single patterned metal layer exposing a patterned dielectric layer, according to a first set of embodiments of the invention.

FIGS. 1A through 1G are schematic views showing a method of manufacturing a substrate having a single patterned metal layer exposing a patterned dielectric layer, according to a first set of embodiments of the invention. In one embodiment, a carrier 20 is provided, and metal layers 201 and 202 are formed adjacent to an upper surface and a lower surface of the carrier 20, respectively, as shown in FIG. 1A. Each metal layer may be a metal foil. Alternatively, each layer 201 and 202 may include an electrically conductive material that is not a metal. Each of the metal layers 201 and 202 includes an upper surface and a lower surface. For example, the metal layer 201 includes the upper surface 201a and the lower surface 201b, where the lower surface 201b is adjacent to the carrier 20.

Figure 1B:
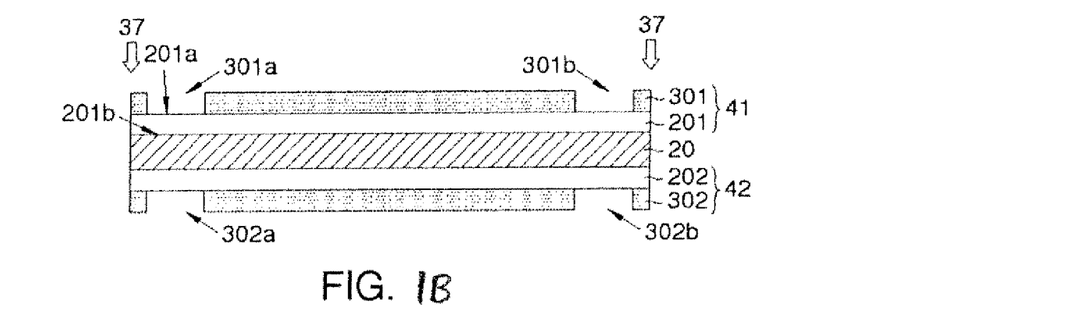

As shown in FIG. 1B, the patterned dielectric layers 301 and 302 are then formed adjacent to the upper surfaces of the metal layers 201 and 202, respectively. The patterned dielectric layer 301 defines openings 301a and 301b that expose a part of the upper surface 201a of the metal layer 201. In one embodiment, a part of the patterned dielectric layer 301 extends to a plane 37. The plane 37 may be a cutting plane on which singulation may subsequently take place. Similarly, the patterned dielectric layer 302 defines openings 302a and 302b that expose a part of the upper surface of the metal layer 202. In one embodiment, a part of the patterned dielectric layer 302 also extends to the plane 37. The patterned dielectric layer may include, but is not limited to, at least one of a solder mask layer (SM), a liquid crystal polymer (LCP), a prepreg (PP), and a molding compound.

Figure 1C:
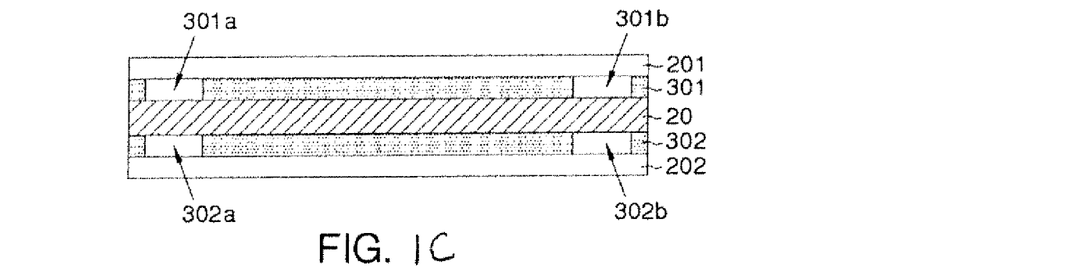

FIG. 1B shows transitional structures 41 and 42. In one embodiment, the transitional structure 41 adjacent to a side of the carrier 20 comprises the metal layer 201 and the patterned dielectric layer 301. Similarly, the transitional structure 42 adjacent to the other side of the carrier 20 comprises the metal layer 202 and the patterned dielectric layer 302. Then, the transitional structures 41 and 42 are removed from the carrier 20. Each of the transitional structures 41 and 42 are re-oriented on (re-placed inversely on) the carrier 20, so that the patterned dielectric layers 301 and 302 are each disposed on the carrier 20, as shown in FIG. 1C.

Figure 1D:
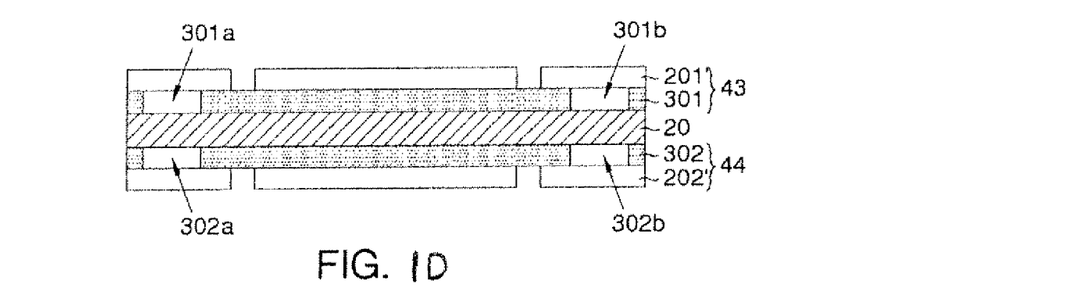

Next, the metal layers 201 and 202 are patterned to form patterned metal layers 201' and 202', as shown in FIG. 1D. In one embodiment, formation of the patterned metal layers 201' and 202' can be done as follows. A dry film can be formed on each of the metal layers 201 and 202, followed by exposing and developing to form a patterned dry film on each side of the carrier 20. The metal layers 201 and 202 can then be etched based on the patterned dry films to form the patterned metal layers 201' and 202'. The patterned dry films are then removed.

Figure 1E:
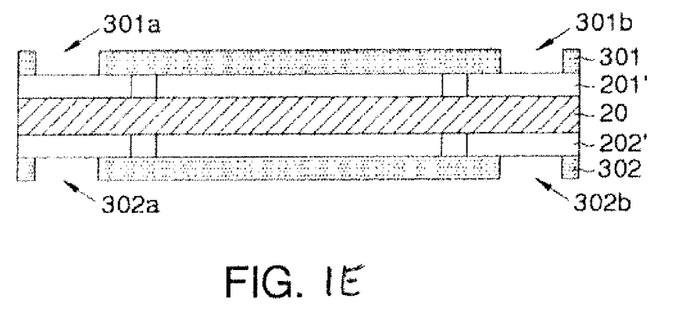

As shown in FIG. 1D, a transitional structure 43 includes the patterned metal layer 201' and the patterned dielectric layer 301, and a transitional structure 44 includes the patterned metal layer 202' and the patterned dielectric layer 302. As shown in FIG. 1E, the transitional structure 43 is removed from the carrier 20 and re-oriented on (re-placed inversely on) the carrier 20, so that the patterned metal layer 201' is disposed on the carrier 20. Similarly, the transitional structure 44 is removed from the carrier 20 and re-oriented on (re-placed inversely on) the carrier 20 in an inverted orientation for manufacturing operations, so that the patterned metal layer 202' is disposed on the carrier 20.

Figure 1F:
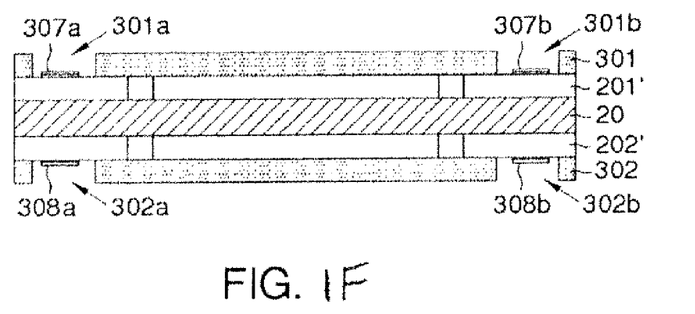

The patterned metal layers 201' and 202' of FIG. 1E may optionally be further subjected to a surface treatment to form surface finish layers on one or more exposed surfaces of the patterned metal layers 201' and 202'. These surface finish layers can enhance electrical connection to the patterned metal layers 201' and 202'. In one embodiment, the surface finish layers 307a and 307b may be formed on a part of the surface 201a (see FIG. 1B) of the patterned metal layer 201' exposed by the openings 301a and 301b defined by the patterned dielectric layer 301, as shown in FIG. 1F. Similarly, the surface finish layers 308a and 308b may be formed on a part of the surface of the patterned metal layer 202' exposed by the openings 302a and 302b defined by the patterned dielectric layer 302, as shown in FIG. 1F.

Then, two sets of substrates are removed from the carrier 20. Each set of substrates includes one or more substrates having the structure of substrate 51 shown in FIG. 1G. For example, each set of substrates may be an array of substrates 51 that is subsequently singulated (see FIG. 3) to form each individual substrate 51. As shown in FIGS. 1A through 1G, similar processing can be performed on both sides of the carrier 20 to form a set of substrates on each side of the carrier 20 during a typical processing time period, thus increasing manufacturing efficiency.

Figure 1G:
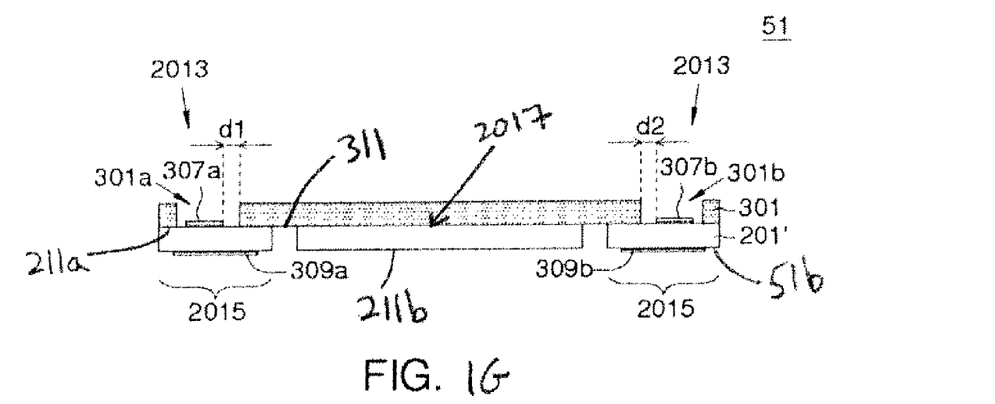

The substrate 51 shown in FIG. 1G may be the substrate formed on the upper side of the carrier 20. The patterned dielectric layer 301 exposes a part of the upper surface 211a of the patterned metal layer 201' to form upper contact pads 2013 for electrical connection externally to, for example, the substrate 51. The electrical connection may be upwardly from the upper contact pads 2013. In one embodiment, the upper contact pads 2013 may be bonding pads. The surface finish layers 307a and 307b optionally may be formed on at least one of the upper contact pads 2013. Also, in one embodiment, each of the patterned dielectric layers 301 and 302 may include at least a slot opening exposing the upper contact pads 2013. In addition, a part of the lower surface 211b of the patterned metal layer 201' forms lower contact pads 2015. The electrical connection may be downwardly from the lower contact pads 2015. In one embodiment, the lower contact pads 2015 may be ball pads. Conductive material, such as solder balls, may be attached to the lower contact pads 2015. In one embodiment, positions of the lower contact pads 2015 may correspond to positions of the upper contact pads 2013, as shown in FIG. 1G for the substrate 51. Also, in one embodiment, the patterned metal layer 201' optionally may include a dummy trace for reducing warpage of the substrate 51.

The patterned metal layer 201' exposes a lower surface 311 of the patterned dielectric layer 301. The lower surface 211b of the patterned metal layer 201' and the portions of the lower surface 311 that are exposed by the patterned metal layer 201' may define a lower surface 51b of the substrate 51. The portions of the lower surface 311 that are exposed by the patterned metal layer 201' may be exposed on the lower periphery 51b of the substrate 51. An advantage of the substrate 51 is that the substrate 51 can be especially thin because the substrate 51 does not include an additional insulating layer (such as a patterned dielectric layer) adjacent to the lower surface 211b of the single patterned metal layer 201'. The substrate 51 may include a single patterned dielectric layer 301 adjacent to the upper surface 211a of the single patterned metal layer 201'.

In one embodiment, each of the upper contact pads 2013 is spaced apart from any other of the upper contact pads 2013 to achieve electrical isolation, and to prevent shorting, between the upper contact pads 2013. Similarly, each of the lower contact pads 2015 is spaced apart from any other of the lower contact pads 2015 to achieve electrical isolation, and to prevent shorting, between the lower contact pads 2015.

In one embodiment, the patterned metal layer 201' may include a die support pad 2017. In this embodiment, the die support pad 2017 is covered by the patterned dielectric layer 301

The surface finish layers 309a and 309b optionally may be formed on at least one of the lower contact pads 2015 to enhance electrical connectivity to a printed circuit board external to the substrate 51. Also, materials chosen for making the surface finish layers 307a, 307b, 309a, and 309b may be identical or different. In one embodiment, materials of the surface finish layers 307a, 307b, 309a, and 309b are independently selected from the group consisting of Ni/Au, NiPdAu, Ni/Ag, Au, Tin, Tin-lead alloy, silver, OSP and any combination thereof. Alternatively, the final surface treatments for the first and second contact pads can be performed by selective plating of electroless nickel/electroless palladium/immersion gold (ENEPIG) and OSP depending on application requirements.

In one embodiment (shown in FIG. 3G), the surface finish layers 307a and 307b formed on the upper contact pads 2013 are spaced apart from sidewalls of the patterned dielectric layer 301 by distances d1 and d2, respectively. These distances d1 and d2 may be the same or different, depending on application requirements. Alternatively, the surface finish layers 307a and 307b can be adjacent to the patterned dielectric layer 301.

Second Set of Embodiments

FIGS. 2A through 2F are schematic views showing a method of manufacturing a substrate having a single patterned metal layer exposing a patterned dielectric layer, according to a second set of embodiments of the invention. The embodiment illustrated in FIGS. 2A through 2F is largely similar to the embodiment illustrated in FIGS. 1A through 1G described previously, so the description of FIGS. 2A through 2F below does focuses on differences with the embodiment of FIGS. 1A through 1G, and redundant discussion is omitted. Please refer to the description of FIG. 1 for additional description of features illustrated in FIG. 2 that are designated with the same reference numbers as features illustrated in FIG. 1. The features of the embodiment illustrated in FIG. 2 that are structurally similar to features of the embodiment illustrated in FIG. 1 are designated with the same reference numbers.

Figure 2A:
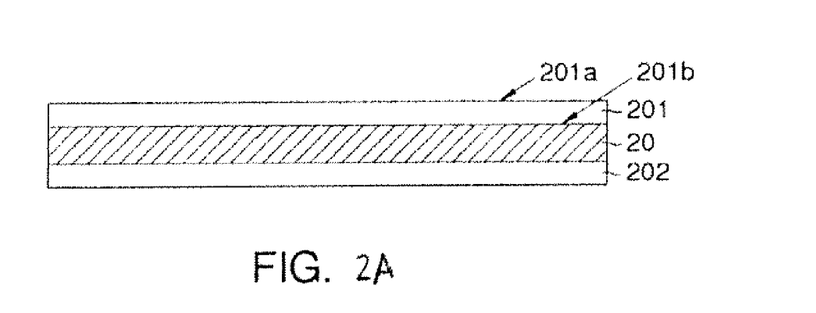
FIGS. 2A through 2F are schematic views showing a method of manufacturing a substrate having a single patterned metal layer exposing a patterned dielectric layer, according to a second set of embodiments of the invention.
Figure 2B:
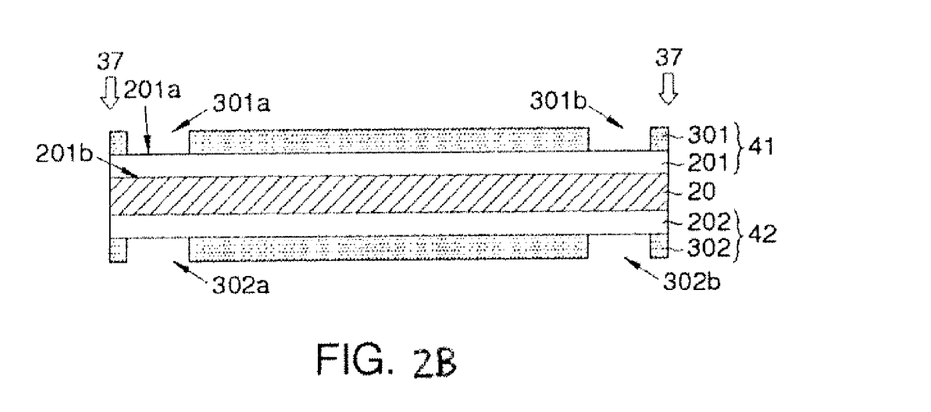
Figure 2C:
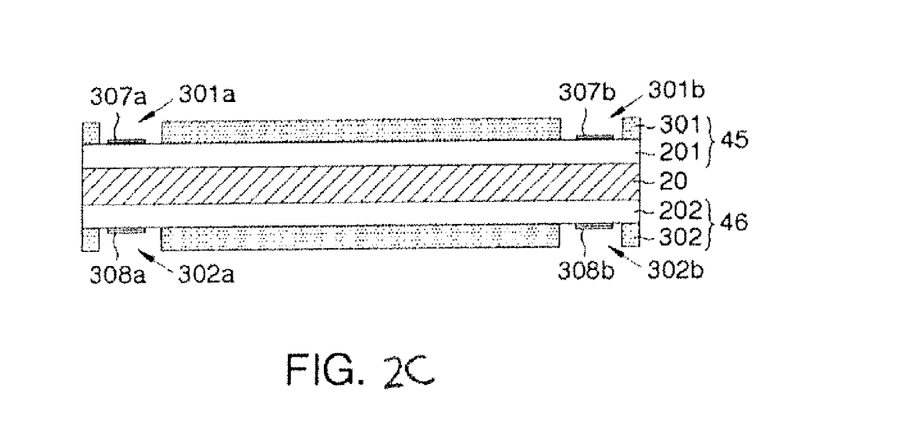

The processing associated with FIGS. 2A and 2B is similar to the processing associated with FIGS. 1A and 1B, which has been previously described. In FIG. 2C, the surface finish layers 307a and 307b are disposed adjacent to the metal layer 201 to form transitional structure 45, and the surface finish layers 308a and 308b are disposed adjacent to the metal layer 202 to form transitional structure 46. This occurs prior to patterning of the metal layers 201 and 202, in contrast to the embodiment illustrated in FIG. 1 (see FIG. 1F).

Figure 2D:
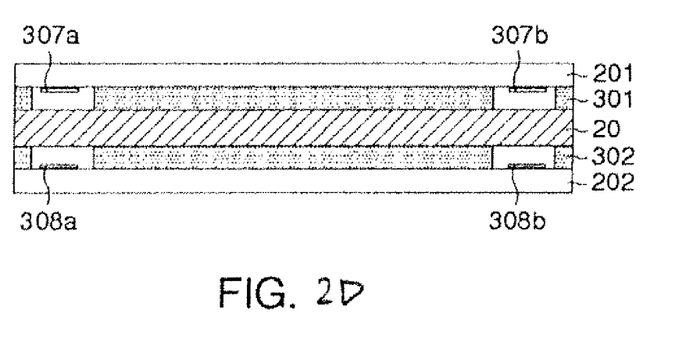
Figure 2E:
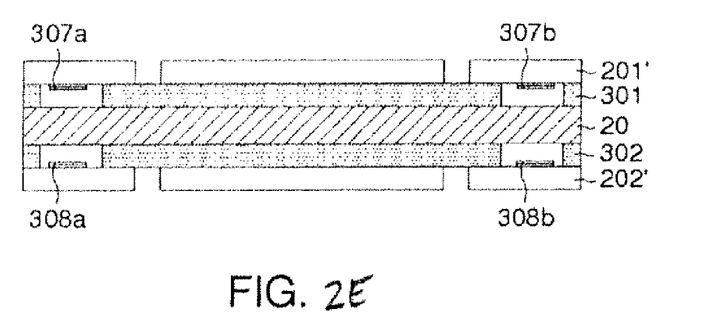

In FIG. 2D, the transitional structure 45 is removed from the carrier 20 and re-oriented on (re-placed inversely on) the carrier 20. The transitional structure 46 is removed from the carrier 20 and re-oriented on (re-placed inversely on) the carrier 20 in an inverted orientation for manufacturing operations. The difference between the transitional structures 45 and 46 and the transitional structures 43 and 44 that are re-oriented in FIG. 1C is that the transitional structures 45 and 46 include the surface finish layers 307 and 308, respectively. The processing associated with FIG. 2E is similar to the processing associated with FIG. 1D.

In the process of FIG. 2, there is no need to re-orient transitional structures on the carrier 20 again (such as is shown in FIG. 1E). Instead, in FIG. 2F, two sets of substrates are removed from the carrier 20, similar to in FIG. 1G. Similar to FIG. 1G, each set of substrates includes one or more substrates having the structure of substrate 51. For example, each set of substrates may be an array of substrates 51 that is subsequently singulated (see FIG. 3) to form each individual substrate 51. Also similar to FIG. 1G, the surface finish layers 309a and 309b optionally may be formed on at least one of the lower contact pads 2015 to enhance electrical connectivity to a printed circuit board external to the substrate 51.

Figure 2F:
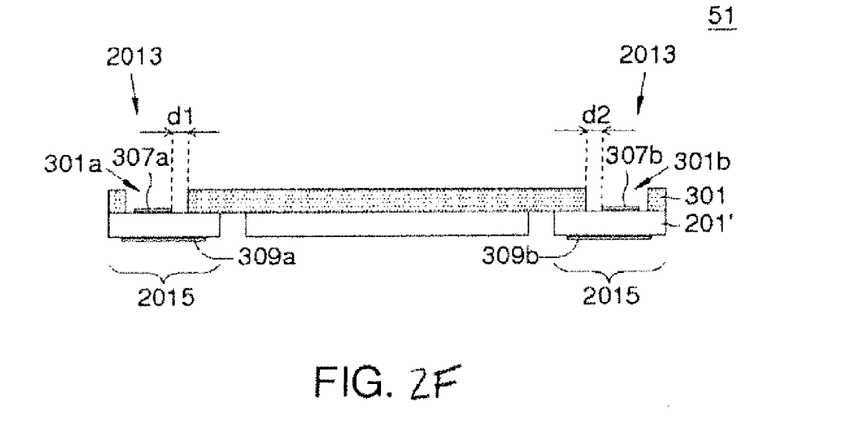
Figure 3:
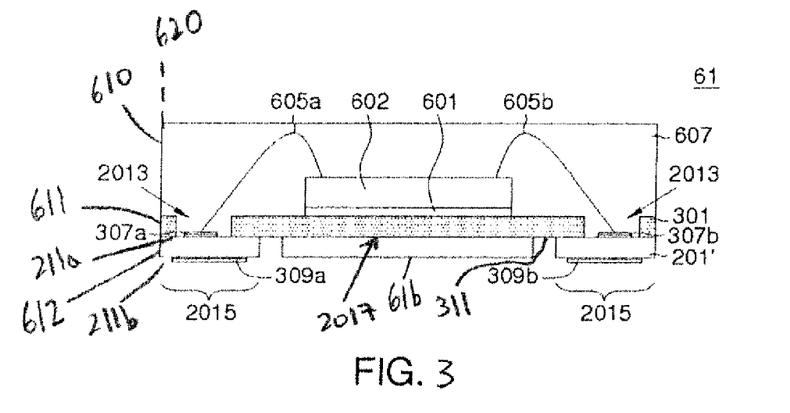
FIG. 3 is a schematic view showing a chip package structure including the substrate of FIG. 1G according to the first set of embodiments of the invention, or the substrate of FIG. 2F, according to the second set of embodiments of the invention.

FIG. 3 is a schematic view showing a chip package structure 61 including the substrate 51 of FIG. 1G according to the first set of embodiments of the invention, or the substrate 51 of FIG. 2F, according to the second set of embodiments of the invention. Alternatively, a chip package structure that is in most respects similar to the chip package structure 61 may be formed including a substrate similar to the substrate 51 but not including one or more of the surface finish layers 307a, 307b, 308a, and 308b. The package 61 includes the substrate 51, a die 602 disposed adjacent to the patterned dielectric layer 301 (which covers the die support pad 2017 in this embodiment), bonding wires 605, and a package body 607. A lower surface of the die 602 is attached to the patterned dielectric layer 301 with an adhesive material 601 (such as epoxy). The active surface of the die 602 is electrically connected to the contact pads 2013 through the bonding wires 605a and 605b. The die 602 and the patterned dielectric layer 301 are positioned on the same side of the patterned metal layer 201'.

As described previously, the patterned metal layer 201' exposes the lower surface 311 of the patterned dielectric layer 301. The lower surface 211b of the patterned metal layer 201' and the portions of the lower surface 311 that are exposed by the patterned metal layer 201' may define a lower surface 61b of the package 61. The portions of the lower surface 311 that are exposed by the patterned metal layer 201' may be exposed on the lower periphery 61b of the package 61.

A molding compound is applied adjacent to the patterned dielectric layer 301 to cover the patterned dielectric layer 301, the upper surface 211a of the patterned metal layer 201', the die 602, and the bonding wires 605. After application of the molding compound to a superstrate including an array of multiple substrates 51, singulation may be used to separate the resulting structure into multiple individual packages 61, where each package 61 includes an individual substrate 51, and an individual package body 607 formed from the molding compound. The bonding wires 605 may be formed of at least one of gold, silver, copper, aluminum, and alloys thereof. The material selected for the molding compound should be electrically insulating, such as epoxy. In addition, after singulation to obtain the package 61, the package body 607, the patterned dielectric layer 301, and the patterned metal layer 201' are laterally aligned. In one embodiment, a lateral surface 610 of the package body 607, a lateral surface 611 of the patterned dielectric layer 301, and a lateral surface 612 of the patterned metal layer 201' define a plane 620.

As described previously, in one embodiment the substrate 51 is a two-layer structure comprising the single patterned, electrically conductive layer 201' and the patterned dielectric layer 301. Alternatively, the substrate 51 may additionally include one or more surface finish layers 307 and/or 308 of minimal thickness adjacent to the single patterned, electrically conductive layer 201'. Compared to typical substrates having multiple metal and/or insulating (such as dielectric) layers, the substrate 51 is very thin, and may have a thickness in the range of about 40 μm to about 150 μm. The thickness of the substrate 51 may also be in one of the ranges of about 40 μm to about 60 μm, about 60 μm to about 80 μm, about 80 μm to about 100 μm, and about 40 μm to about 130 μm, although the thickness of the substrate 51 is not constrained to any of these ranges. As a result, the size of a package including the substrate 51 can be effectively reduced.

Although FIGS. 3A through 3G and FIGS. 4A through 4F illustrate manufacturing of substrates taking place on both sides of the carrier for increasing production rate, these embodiments do not limit the invention. In other embodiments, the manufacturing of substrates may also take place on only a single side of the carrier.

Modifications and variations to the substrate 51 depicted in FIGS. 1G and 2F, the package 61 depicted in FIG. 3, manufacturing methods thereof, and related embodiments can be made within the scope of the invention to meet the requirements of practical applications.

Third Set of Embodiments

Figure 4A:
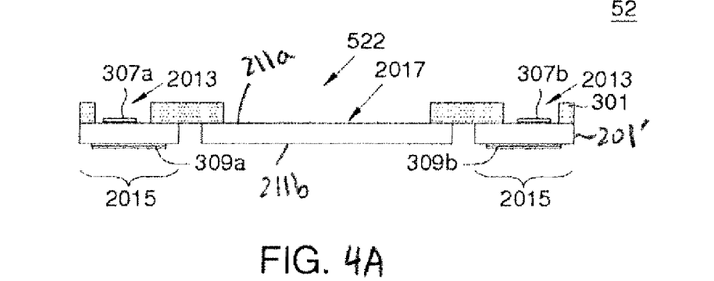
FIG. 4A is a schematic view showing an alternative substrate manufactured according to a third set of embodiments of the invention.

In other embodiments, the substrate structure can be varied from that of the substrate 51 previously described. FIG. 4A is a schematic view showing an alternative substrate 52 manufactured according to a third set of embodiments of the invention. Please refer to the description of FIG. 1 for additional description of features illustrated in FIG. 4A that are designated with the same reference numbers as features illustrated in FIG. 1. The features of the embodiment illustrated in FIG. 4A that are structurally similar to features of the embodiment illustrated in FIG. 1 are designated with the same reference numbers.

The processes of manufacturing the substrate 52 of FIG. 4A are similar to the processes illustrated by FIGS. 1A through 1G or FIGS. 2A through 2F, and redundant discussion is omitted. A difference in the process of manufacturing the substrate 52 is that the patterned dielectric layer 301 exposes the die support pad 2017 to create a die receiving area 522 corresponding to the position of the die support pad 2017. In one embodiment, the die receiving area 522 fully exposes the die support pad 2017.

Figure 4B:
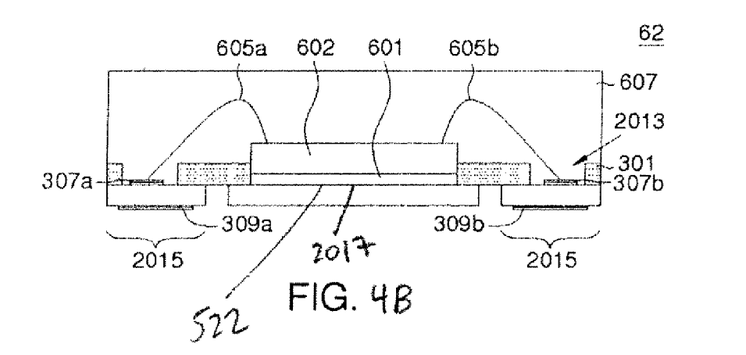
FIG. 4B is a schematic view showing a chip package structure including the substrate of FIG. 4A, according to the third set of embodiments of the invention.

FIG. 4B is a schematic view showing a chip package structure 62 including the substrate 52 of FIG. 4A, according to the third set of embodiments of the invention. The package 62 is similar to the package 61 shown in FIG. 3, except that the die 602 is positioned within the die receiving area 522, and the lower surface of the die 602 is attached to the die support pad 2017 instead of being attached to the patterned dielectric layer 301. For this reason, the overall thickness of the package 62 can be thinner than that of the package 61.

Similar to the substrate 51, an advantage of the substrate 52 is that the substrate 52 can be especially thin because the substrate 52 does not include an additional insulating layer (such as a patterned dielectric layer) adjacent to the lower surface 211b of the single patterned metal layer 201'. The substrate 52 may include a single patterned dielectric layer 301 adjacent to the upper surface 211a of the single patterned metal layer 201'.

Similarly, the substrate as shown in FIG. 6A and FIG. 6B mainly includes a single layer of metal foil (201'/202', functioning as the conductive layer) and a single layer of patterned dielectric layer (301/302). The substrate 52 according to the third embodiment is very thin. The package size applied with the substrate of the third embodiment can be effectively kept to a minimum with this combination. This extra thin substrate is particularly suitable for the application of small-sized product.

Although several types of substrates (51-52) and packages (61-62) have been illustrated with reference to various embodiments, modifications and variations to the substrates, the packages including the substrates, manufacturing methods thereof, and related embodiments can be made within the scope of the invention to meet the requirements of practical applications. For example, the patterning and/or material composition of the metal layer and/or the dielectric layer may be varied depending on application requirements, Also, the die may be wire bonded or flip-chip bonded to the substrate.

The foregoing description and illustrations contained herein demonstrate many of the advantages associated with embodiments of the present invention. Because the substrate includes a single patterned metal layer and a single patterned dielectric layer (instead of multiple patterned metal layers and/or multiple dielectric layers), the thickness of the substrate is reduced, giving rise to a lower profile package. This thinner substrate is particularly suitable for small-size product applications. Also, embodiments of methods for manufacturing the substrates and packages disclosed herein may use a carrier, which render the embodiments of the methods simple, easy to perform, and suitable for mass production. Embodiments of the substrate have advantages of high yield of production, thin profile, and low cost. Electronic products including the substrate and/or the chip package structure of embodiments of the present invention can leverage these advantages to reduce the size and the cost of these products, which is commercially desirable.

While the invention has been described by way of examples and in terms of embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing chip packages, comprising:
   providing a superstrate including an array of substrates, each substrate including:
   a single patterned metal layer including an upper surface and a lower surface; and
   a patterned dielectric layer adjacent to the upper surface of the single patterned metal layer and including a lower surface;
   wherein a part of the lower surface of the single patterned metal layer forms a plurality of lower contact pads for electrical connection externally;
   wherein the patterned dielectric layer exposes a part of the upper surface of the single patterned metal layer to form a plurality of upper contact pads; and
   wherein at least a part of the lower surface of the single patterned metal layer and a part of the lower surface of the patterned dielectric layer define a lower surface of the substrate;
   electrically connecting a die to the plurality of upper contact pads; forming a molded structure on the patterned dielectric layer to cover the patterned dielectric layer and the die; and
   performing a full-cutting of the molded structure and the superstrate to form a plurality of chip packages, each of the plurality of chip packages including a package body and one of the array of substrates, such that the package body, the patterned dielectric layer, and the single patterned metal layer of each of the plurality of chip packages are laterally aligned,
   wherein providing the superstrate comprises:
   providing a carrier with a metal layer formed adjacent to the carrier;
   forming the patterned dielectric layer adjacent to the metal layer to form the plurality of upper contact pads;
   re-orienting the metal layer and the patterned dielectric layer such that the patterned dielectric layer is between the metal layer and the carrier; and
   patterning the metal layer to form the single patterned metal layer, and to form the plurality of lower contact pads.

2. The method of claim 1, wherein after forming the patterned dielectric layer, a part of the metal layer is exposed by the patterned dielectric layer, and further comprising applying a surface treatment to form a surface finish layer adjacent to the part of the metal layer.

3. The method of claim 1, further comprising:
re-orienting the patterned dielectric layer and the single patterned metal layer such that the single patterned metal layer is between the patterned dielectric layer and the carrier.

4. The method of claim 1, further comprising:
forming a first surface finish layer adjacent to at least one of the upper contact pads, and forming a second surface finish layer adjacent to at least one of the lower contact pads, wherein the first surface finish layer is spaced apart from a sidewall of the patterned dielectric layer.

5. The method of claim 1, wherein forming the patterned dielectric layer further comprises forming a slot in the patterned dielectric layer to expose the plurality of upper contact pads.

6. The method of claim 1, wherein:
each of the plurality of upper contact pads is electrically isolated from any other of the plurality of upper contact pads; and
each of the plurality of lower contact pads is electrically isolated from any other of the plurality of lower contact pads.

7. The method of claim 1, wherein the single patterned metal layer includes at least a die support pad, the die support pad being covered by the patterned dielectric layer; and
further comprising disposing the die adjacent to the patterned dielectric layer.

8. The method of claim 1, wherein the single patterned metal layer includes at least a die support pad, the die support pad being exposed by the patterned dielectric layer to create a die receiving area; and
further comprising disposing the die adjacent to the upper surface of the single patterned metal layer within the die receiving area.

9. The method of claim 1, wherein providing the superstrate comprises:
providing the carrier including an upper surface and a lower surface;
forming the array of substrates, wherein the array of substrates includes a first substrate and a second substrate, comprising:
forming a first metal layer adjacent to the upper surface of the carrier;
forming a second metal layer adjacent to the lower surface of the carrier;
forming the patterned dielectric layer of the first substrate adjacent to the first metal layer to form a first structure, and to form the plurality of upper contact pads of the first substrate;
forming the patterned dielectric layer of the second substrate adjacent to the second metal layer to form a second structure, and to form the plurality of upper contact pads of the second substrate;
re-orienting the first structure on the carrier such that the patterned dielectric layer of the first substrate is between the first metal layer and the carrier;
re-orienting the second structure on the carrier such that the patterned dielectric layer of the second substrate is between the second metal layer and the carrier;
patterning the first metal layer to form the single patterned metal layer of the first substrate, and to form the plurality of lower contact pads of the first substrate; and
patterning the second metal layer to form the single patterned metal layer of the second substrate, and to form the plurality of lower contact pads of the second substrate.

10. A method of manufacturing chip packages, comprising:
providing a carrier;
attaching a metal layer to the carrier;
attaching a dielectric layer to an upper surface of the metal layer;
patterning the dielectric layer to expose portions of the metal layer;
detaching the metal layer and the patterned dielectric layer from the carrier;
inverting the metal layer and the patterned dielectric layer;
attaching the patterned dielectric layer to the carrier; and
patterning the metal layer.

11. The method of claim 10, wherein the exposed portions of the metal layer include an upper contact pad, and further comprising forming a surface finish layer on the upper contact pad.

12. The method of claim 11, wherein the surface finish layer is spaced apart from a sidewall of the patterned dielectric layer.

13. The method of claim 10, wherein patterning the metal layer exposes portions of the patterned dielectric layer.

14. The method of claim 10, wherein the exposed portions of the metal layer include an upper contact pad, and patterning the metal layer includes forming a lower contact pad, and the upper contact pad is substantially co-located with the lower contact pad.

15. A method of manufacturing chip packages, comprising:
providing a superstrate including an array of substrates, each substrate including:
a single patterned metal layer including an upper surface and a lower surface; and
a patterned dielectric layer adjacent to the upper surface of the single patterned metal layer and including a lower surface;
wherein a part of the lower surface of the single patterned metal layer forms a plurality of lower contact pads for electrical connection externally;
wherein the patterned dielectric layer exposes a part of the upper surface of the single patterned metal layer to form a plurality of upper contact pads; and
wherein at least a part of the lower surface of the single patterned metal layer and a part of the lower surface of the patterned dielectric layer define a lower surface of the substrate,
wherein providing the superstrate comprises:
providing a carrier with a metal layer adjacent to the carrier;
forming the patterned dielectric layer adjacent to the metal layer to form a first structure, and to form the plurality of upper contact pads;
re-orienting the first structure on the carrier such that the patterned dielectric layer is between the metal layer and the carrier; and
patterning the metal layer to form the single patterned metal layer, and to form the plurality of lower contact pads.

16. The method of claim 15, further comprising forming a surface finish layer adjacent to at least one of the plurality of upper contact pads, and the surface finish layer is spaced apart from a sidewall of the patterned dielectric layer.

17. The method of claim 15, further comprising forming a surface finish layer adjacent to at least one of the plurality of lower contact pads, and the surface finish layer is spaced apart from a periphery of the at least one of the plurality of lower contact pads.

18. The method of claim 15, wherein at least one of the plurality of upper contact pads directly overlies at least a portion of a corresponding one of the plurality of lower contact pads.

* * * * *